US006981100B2

(12) United States Patent
Ryan et al.

(10) Patent No.: US 6,981,100 B2
(45) Date of Patent: *Dec. 27, 2005

(54) SYNCHRONOUS DRAM WITH SELECTABLE INTERNAL PREFETCH SIZE

(75) Inventors: Kevin J. Ryan, Eagle, ID (US); Christopher S. Johnson, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/972,324

(22) Filed: Oct. 26, 2004

(65) Prior Publication Data

US 2005/0083758 A1    Apr. 21, 2005

Related U.S. Application Data

(63) Continuation of application No. 10/133,386, filed on Apr. 29, 2002.

(51) Int. Cl.[7] ............................................. G06F 12/00
(52) U.S. Cl. .................. 711/137; 711/105; 711/167; 712/207
(58) Field of Search ................. 711/137, 105, 167; 712/207; 713/400

(56) References Cited

U.S. PATENT DOCUMENTS

| | | | |
|---|---|---|---|
| 5,577,224 A | | 11/1996 | DeWitt et al. |
| 5,713,003 A | | 1/1998 | DeWitt et al. |
| 5,778,436 A | * | 7/1998 | Kedem et al. ............... 711/137 |
| 5,890,211 A | | 3/1999 | Sokolov et al. |
| 6,035,375 A | | 3/2000 | Yanai et al. |
| 6,314,431 B1 | | 11/2001 | Gornish |
| 6,606,688 B1 | | 8/2003 | Koyanagi et al. |
| 6,636,945 B2 | | 10/2003 | Nakamura |
| 6,728,839 B1 | | 4/2004 | Marshall |
| 6,895,474 B2 | * | 5/2005 | Ryan et al. ................. 711/137 |

OTHER PUBLICATIONS

Lee et al., "A New Column Redundancy Scheme for Yield Improvement of High Speed DRAMs with Multiple Bit Pre-fetch Structure", © 2001 Symposium on VLSI Circuits Digest of Technical Papers, p. 69-70.*
Sato, et al., "A 5-GByte/s Data-Transfer Scheme with Bit-to Bit Skew Control for Synchronous DRAM", © 1999 IEEE, p. 653-660.*
Chen, "An Effective Programmable Prefetch Engine for On-Chip Caches", 1995, IEEE, p. 237-242.
Chiueh, "Sunder: A Programmable Hardware Prefetch Architecture for Numerical Loops", 1994, IEEE p. 488-497.

* cited by examiner

*Primary Examiner*—Brian R. Peugh
(74) *Attorney, Agent, or Firm*—Dickstein Shapiro Morin & Oshinsky LLP

(57) ABSTRACT

A synchronous memory device and its method of operation which can be set to operate at a plurality of supported prefetch modes. The prefetch mode may be set by programming a portion of a mode register of the memory device or by setting one or more programmable elements. For read operations, the synchronous memory device internally reads data corresponding to the largest supported prefetch size, and outputs read data corresponding to the current mode. For write operations the synchronous memory accepts write data corresponding to the selected prefetch mode and writes the received data to the array. Data words corresponding to data not received are masked from writing via a write masking circuit.

32 Claims, 5 Drawing Sheets

SYNCHRONOUS DRAM WITH SELECTABLE INTERNAL PREFETCH SIZE

This application is a continuing application of U.S. application Ser. No. 10/133,386 (now U.S. Pat. No. 6,828,964) filed Apr. 29, 2002, the disclosure of which is hereby incorporated by reference.

FIELD OF INVENTION

The present invention relates to memory devices. More specifically, the present invention relates to synchronous memory devices which supports at least two internal prefetch sizes.

BACKGROUND OF THE INVENTION

Dynamic random access memory (DRAM) integrated circuit devices have existed for more than thirty years and have undergone tremendous increases in both storage capacity as well as speed. These advances have been achieved through advances in semiconductor fabrication technology and circuit design technology. The quest to increase memory speeds has lead to several changes in DRAM devices. In recent years, DRAM devices have transitioned towards synchronous operation. That is, synchronous DRAM (SDRAM) devices accept commands and transfers data synchronized to a clock signal. A recent variation on SDRAM is the introduction of double data rate (DDR) SDRAM devices. DDR devices still accept commands aligned on the rising clock edge, but transfer data on both the rising and falling clock edges.

Internally, SDRAM devices store data in memory cells. Each memory cell stores one bit of data and is organized into an array which can be addressed by a row address and a column address. Each device outputs or accepts a n-bit word of data, where n is an integer, for each read or write, respectively. Thus, each SDRAM device typically includes a plurality of arrays which are read simultaneously using the same row and column address in order to output or accept n-bits of data simultaneously. Alternatively, some SDRAM memory device may accept a column address which maps to multiple column lines, and thus a plurality of memory cells. One limitation on increasing memory device speed is the rate at which column lines can be switched within a memory array. That is, the clock cycle time supplied to an SDRAM is ordinarily limited by the maximum speed which the memory arrays can switch column lines.

A solution to increasing data transfer rates beyond the limitations imposed by the maximum speed at which column lines can be switched is to employ prefetching, which allows the internal column cycle time to be spread across multiple external data transfer periods. Essentially, a single read or write transaction in a prefetching memory device effectively consists of a single wider data transfer over one internal data transfer period (at the SDRAM core) and a corresponding number of consecutive n-bit wide external data transfers over the corresponding number of external data transfer periods. For example, one common prefetch mode is known as 2n prefetch. If each word is 32-bits (n), each read causes 64-bits (2n) to be read from the internal arrays over a single internal data transfer period, and 32-bits are output from the SDRAM device over each of two consecutive external data transfer periods. Another common prefetch mode is known as 4n prefetch, in which the internal read is four times the width of the SDRAM's external interface, and data is output over four consecutive external data transfer periods. In a SDRAM, an external data transfer period is one clock cycle, while in DDR SDRAM, an external data transfer period is one half of a clock cycle.

Thus, prefetching permits increasing the data transfer rate of a SDRAM device beyond the limitation imposed by the column line switching speed. The cost of using prefetching is the increased granularity of the data size being read or written simultaneously. For example, in a memory device having 4n prefetch, at least four words of data are output for each read transaction. For burst reads, the minimum burst size would correspond to the size of the prefetch. Burst reads larger than the minimum burst size would be equal to multiples of the prefetch size, unless the burst read is terminated prematurely. Thus, for a 4n prefetch SDRAM device, burst reads are limited to, for example, 4, 8, or 12 words. Many conventional SDRAM devices are designed to operate with a single prefetch level, since each prefetch level requires a differing number of data lines.

One problem introduced by the use of prefetching memory devices relates to compatibility and efficiency. For example, some systems may only be compatible with a particular type of prefetching (e.g., 2n prefetch only). Additionally, other systems may be compatible with a range of prefetching (e.g., 2n- or 4n-prefetch) but may operate more effectively at one of the prefetch modes. Server computers, for example, may favor smaller prefetches such as a 2n prefetch, while workstations may favor larger prefetches, such as a 4n prefetch. Accordingly, there is a need and desire for a method and apparatus to permit a synchronous memory device to operate at a plurality of prefetch levels.

SUMMARY OF THE INVENTION

The present invention is directed to a method and apparatus for a synchronous memory device which is operable at a plurality of prefetch levels. The synchronous memory device of the present invention includes the data lines necessary to support at least a larger prefetch mode and a smaller prefetch mode. The synchronous memory device of the present invention further includes a control logic which is compatible with the plurality of prefetch modes. The control logic detects the prefetch mode, which may be set by a user by toggling bits in a mode register of the memory device, and operates the memory device at the selected prefetch mode. For reads, the control logic causes a read circuit to (internally) read from a memory array an amount of data equal to the largest supported prefetch size. However, the control logic would cause the memory device to only output data corresponding to the selected prefetch size. Any additional data which was read but not associated with the selected prefetch mode would not be output. For writes, the control logic causes a write circuit to accept one word of data per data transfer period. When the write circuit has accepted an amount of data corresponding to the selected prefetch mode, the control logic causes the write circuit to write the accepted data to a row of memory array. Any portion of that row not corresponding to the selected prefetch mode would be masked by the write circuit and not be written.

BRIEF DESCRIPTION OF THE DRAWINGS

The foregoing and other advantages and features of the invention will become more apparent from the detailed description of exemplary embodiments of the invention given below with reference to the accompanying drawings in which.

DETAILED DESCRIPTION OF THE INVENTION

Figure 1:
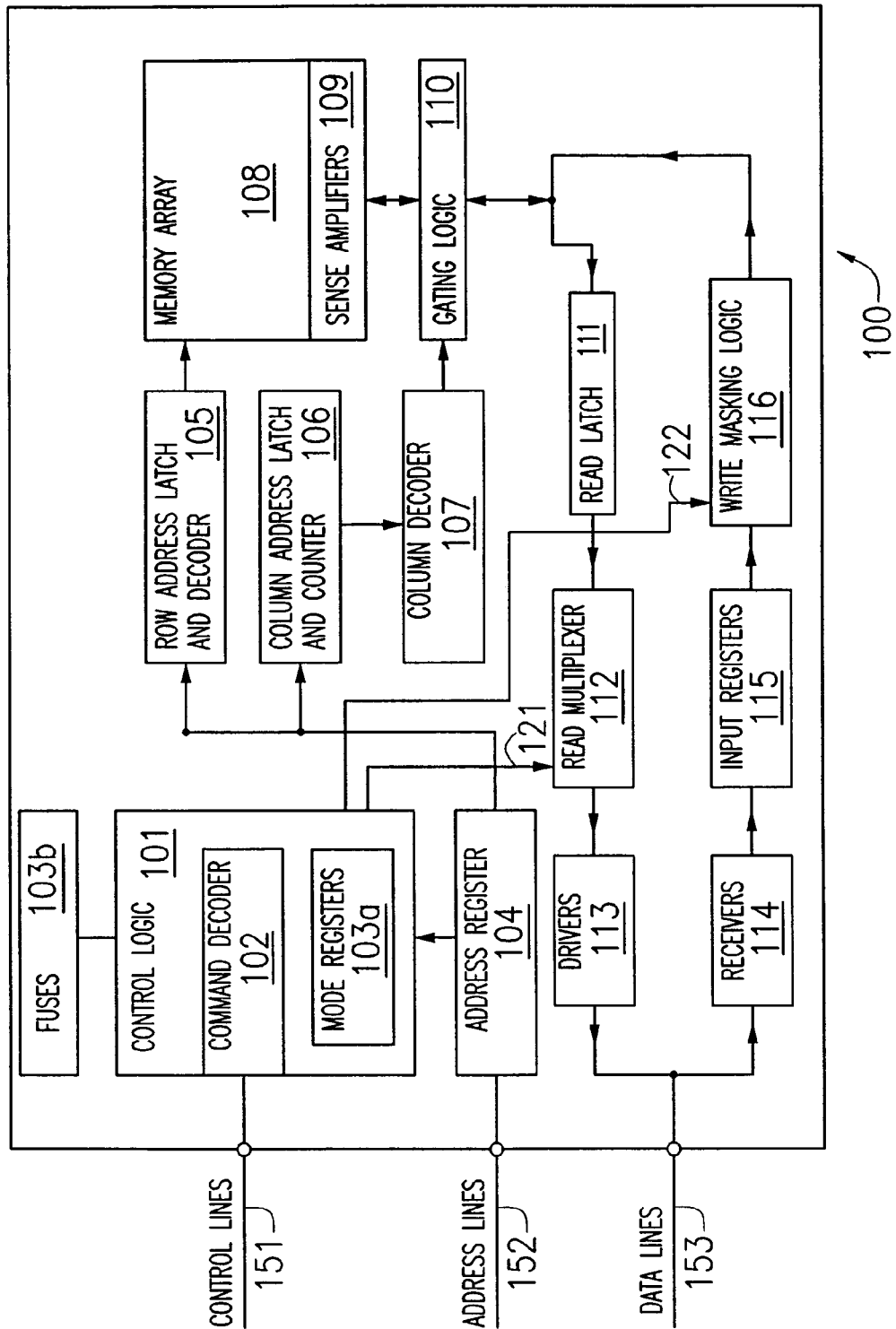
FIG. 1 is a block diagram of a SDRAM in accordance with the principles of the present invention.

Now referring to the drawing, where like reference numerals designate like elements, there is shown in FIG. 1 an SDRAM 100 in accordance with the principles of the present invention. The SDRAM 100 may be a double data rate or a standard data rate SDRAM. The SDRAM 100 includes a plurality of control lines 151. Control lines 151 may include, for example, well known control signals such as clock signals, column address strobe (CAS) signals, row address strobe (RAS) signals, write enable (WE) signals, etc. The control signals are coupled to the control logic 101 of the SDRAM device. More specifically, the control signals are coupled to a command decoder 102 of the control logic 101. The command decoder 102 decodes commands issued by an external memory controller (not illustrated). The control logic 101 also may include one or more mode registers 103a. The control logic 101 may also be coupled to one or more programmable elements such as fuses 103b. Alternatively, the programmable elements 103b may instead be a different type of programmable element, such as anti-fuses.

The SDRAM 100 also includes a plurality of address lines 152, which are coupled to an address register 104. The address register 104 latches row and column addresses supplied by on the address lines 152 and provides the addresses to the row address latch and decoder 105 and column address latch and counter 106, respectively. The row address latch and decoder 105 latches the row address, then decodes the row address to select a row in memory array 108. The illustrated SDRAM 100 contains a single bank of memory implemented as a single memory array 108, however, it should be understood that the principles of the present invention are applicable to memory devices having multiple arrays and/or multiple banks. The column address latch and decoder 106 latches a column address and supplies a sequence of one or more column addresses beginning with the latched address to support burst mode reads and writes. That sequence of column addresses is supplied to a column decoder 107, which, via gating logic 110 selects a column of memory cells in the memory array 108. The sense amplifiers 109 are used in conjunction with the gating logic to read or write the memory cells of the memory array 108.

The gating logic 110 is also coupled, via several circuits to the data lines 153. For outputting read data from the memory array 108 to the data lines 153, the data travels from the gating logic 110 to a read latch 111. The read latch 111 is sufficiently large to hold the data associated with the largest supported prefetch mode of the SDRAM 100. A read multiplexer 112 is coupled to the read latch 111 to permit a portion of the data stored in the read latch 111 to be outputted via the drivers 113 to the data lines 153. Similarly, write data from the data lines 153 is sent to the receivers 114 to be stored into input register 115, which are coupled to a write masking logic 116 to supply data to be written to the memory array to the gating logic 110. The input register 115, like the read latch 111, is sufficiently large to hold the data associated with the largest supported prefetch mode of the SDRAM 100.

Although FIG. 1 illustrates coupling between the above described circuits using single lines, it should be understood that the illustrated signal lines are really a plurality of signal lines for conveying a plurality of signals from one circuit to another. In accordance to the principles of the present invention, these signal lines are sufficiently wide to permit the memory device to operate at the largest supported prefetch size. For example, in one exemplary embodiment, the SDRAM 100 may support 32-bit words and be operable at 2n- and 4n-prefetch modes. Thus, the internal data lines and circuits are sufficiently wide to, for example, permit reading 4×32 or 128 bits of data in a single data transfer period from the memory array 108.

In order to support operating in at least two different prefetch modes, the present invention includes sufficient circuitry to support the larger prefetch mode (i.e., 4n prefetch in the exemplary embodiment). When the memory device is configured to operate at the larger prefetch mode the memory device simply accepts or outputs data consistent with the larger prefetch mode. When the memory device is configured to operate at the smaller prefetch mode (i.e., 2n prefetch in the exemplary embodiment), the memory device masks (i.e., does not output) the portion of data not associated with the selected prefetch mode during reads. Similarly, during writes, the memory device masks out (i.e., does not write) addresses within the memory array which do not correspond to the selected prefetch mode. It should be noted that while the exemplary embodiment describes operating an SDRAM device at either 2n- or 4n-prefetch modes, the principles of the present invention are applicable to memory devices which may support more than two prefetch modes. Similarly, a memory device in accordance with the principles of the present invention may support prefetch modes other than 2n- and 4n-prefetches.

Figure 2:
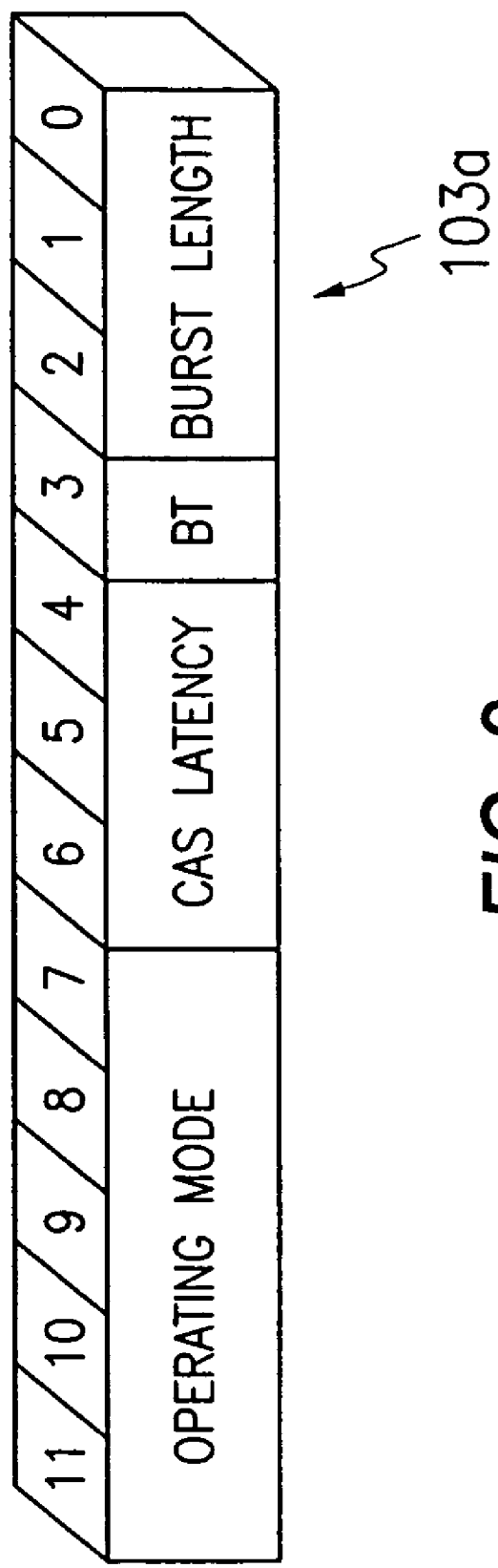
FIG. 2 is an illustration of a mode register of a SDRAM in accordance with one embodiment of the present invention.

The SDRAM 100 may be configured to operate at one of the plurality of supported prefetch modes by programming the one or more mode registers 103a of the control logic 101. FIG. 2 is a more detailed illustration of a mode register 103a. FIG. 2 illustrates a 12-bit mode register 103a, but it should be understood that the mode register 103a may be one or more mode registers and that the number of bits may be varied. Conventionally, bits 0–2 of the mode register are used to encode a burst length, bit 3 is used to store a burst type (i.e., whether burst addresses are sequential or interleaved). Bits 4–6 are conventionally used to encode a CAS latency. Similarly, bits 7–11 normally encode an operating mode.

In the present invention, a set of bits from the mode register 103a are used to encode the prefetch mode. For example, in one exemplary embodiment, the burst length field, for example, bits 0–2 are utilized to store an encoding of a prefetch mode which the SDRAM 100 will operate at. Alternatively, a different group of at least one bit may be used to encode the prefetch mode. For example, one or more of the bits in the operating mode field (e.g., one or more bits from bits 7–11) may be allocated to store the prefetch mode. The advantage of utilizing a mode register 103a to store a prefetch mode is that the mode register fields may be set to a desired value by a memory controller when the memory device is initialized. Thus, a mode register implementation permits a system to set the SDRAM 100 to operate at a specific prefetch mode.

Alternatively, it may be sufficient to configure the SDRAM 100 device once to operate thereafter in a single prefetch mode. For example, the memory manufacturer may wish to produce a single part which can subsequently be permanently set to one of a plurality of prefetch modes. In such situations, the present invention may be practiced via one or more programmable elements, such as fuses 103*b*. In this embodiment, the state of the programmable element selects a prefetch mode. While FIG. 1 illustrates the programmable element as fuses 103*b*, it should be understood that other types of programmable elements, for example, anti-fuses, may be used without departing from the scope of the invention.

Figure 3:
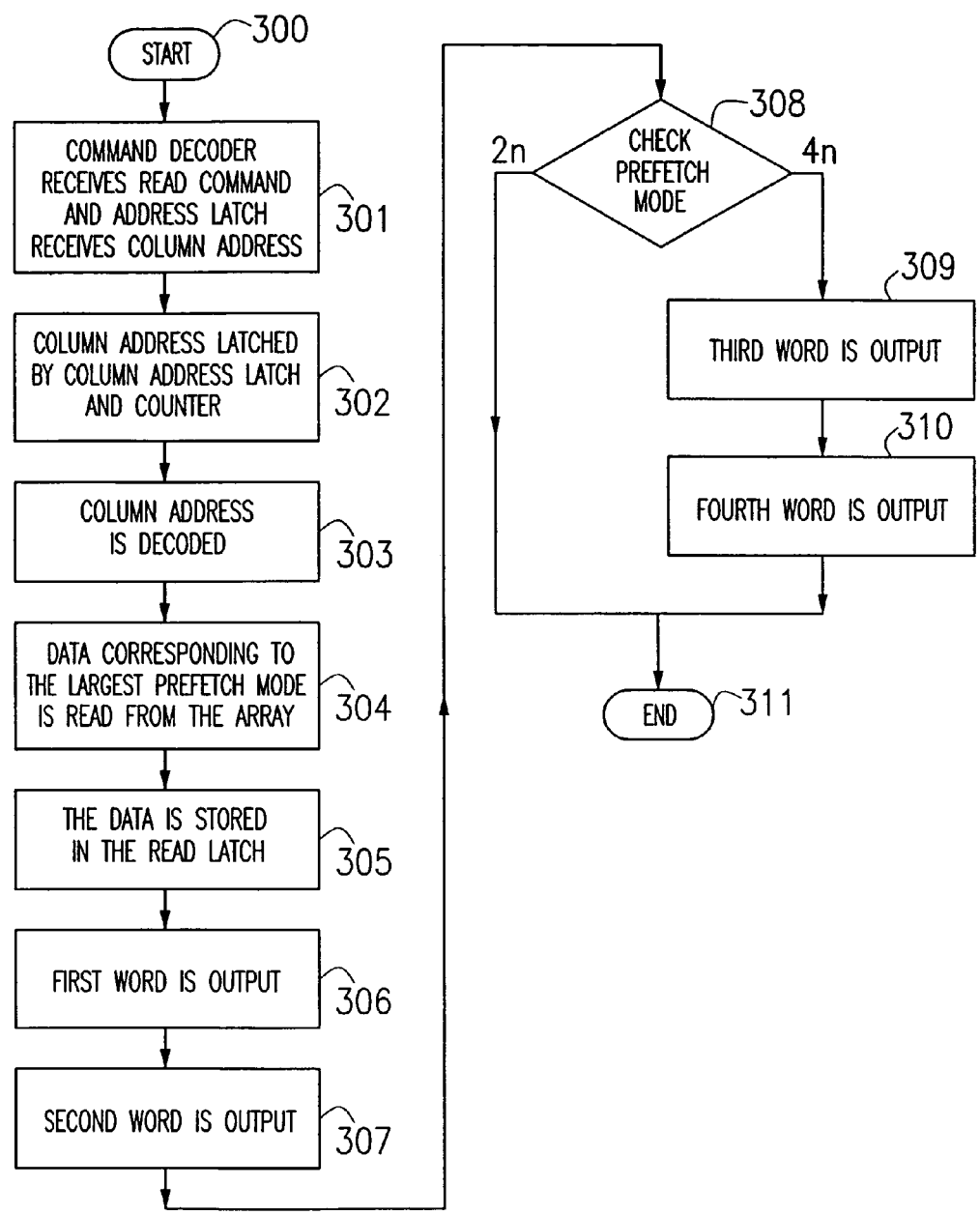
FIG. 3 is a flow chart illustrating a read transaction.

FIG. 3 is a flow chart which describes the steps 300–311 associated with the read process in accordance with the principles of the present invention. The process begins at step 301, where the command decoder 102 receives a read command over control lines 151 and the address register 104 receives a column address over address lines 152. (It is assumed that a row address has been previously latched into the address register 104 through the use of an activate command.) The process continues at step 302, where the column address latch and counter 106 receives and latches the column address from the address register 104. At step 303, the column decoder 107 decodes the column address and passes the decoded column address to the gating logic 110. At step 304, the gating logic, reads from the sense amplifiers a plurality of bits required to satisfy the largest prefetch mode supported by the SDRAM 100. In the exemplary embodiment, the SDRAM 100 supports 2n-and 4n-prefetch modes, so four data words of data would be read at step 304 in the exemplary embodiment. At step 305, the data is stored into the read latch 111.

At this point enough data to satisfy the largest supported prefetch mode has been stored in the read multiplexer 112. The remaining task is to output an amount of data in the correct sequence in accordance with the current prefetch mode. In the exemplary embodiment, the SDRAM 100 supports 2n-and 4n-prefetch modes, so regardless of which mode is supported, the SDRAM 100 always outputs at least two words of data per read. Thus, in step 306, the control logic 101 via signal line 121 causes the read multiplexer 112 to couple the first word of data from the read latch to the drivers 113 to cause the first word of data to appear at the data lines 153. One data transfer period later, at step 307, the control logic 101 causes the second word of data to be output onto data lines 153.

Now that the data corresponding to the 2n-prefetch mode has been output, the control logic 101 needs to determine whether additional data output is required. If the SDRAM 100 is set to operate at 2n prefetch, the two data words have already been output, therefore the read transaction is completed. However, if the SDRAM 100 is set to operate a 4n prefetch, two more data words must be output before the read is completed. Therefore, at step 308, the control logic checks to see which prefetch mode is in effect. As previously described, the control logic 101 may examine a field in a mode register 103*a* or the states of one or more programmable elements such as fuses 103*b*.

If the SDRAM 100 is set to operate at 2n prefetch, the read transaction is completed. Therefore, the execution terminates at step 311. If the SDRAM 100 is set to operate at 4n prefetch, two more data words are required to be output before the read is completed.

At steps 309–310, the control logic 101 via signal lines 121 causes the read multiplexer 112 to respectively couple the third and fourth words of data from the read latch 111 to the drivers 113 to cause the third and fourth words to be output onto the data lines 153 on successive data transfer periods. At this point, all four data words corresponding to the 4n prefetch mode has been output, so execution terminates at step 311.

Figure 4:
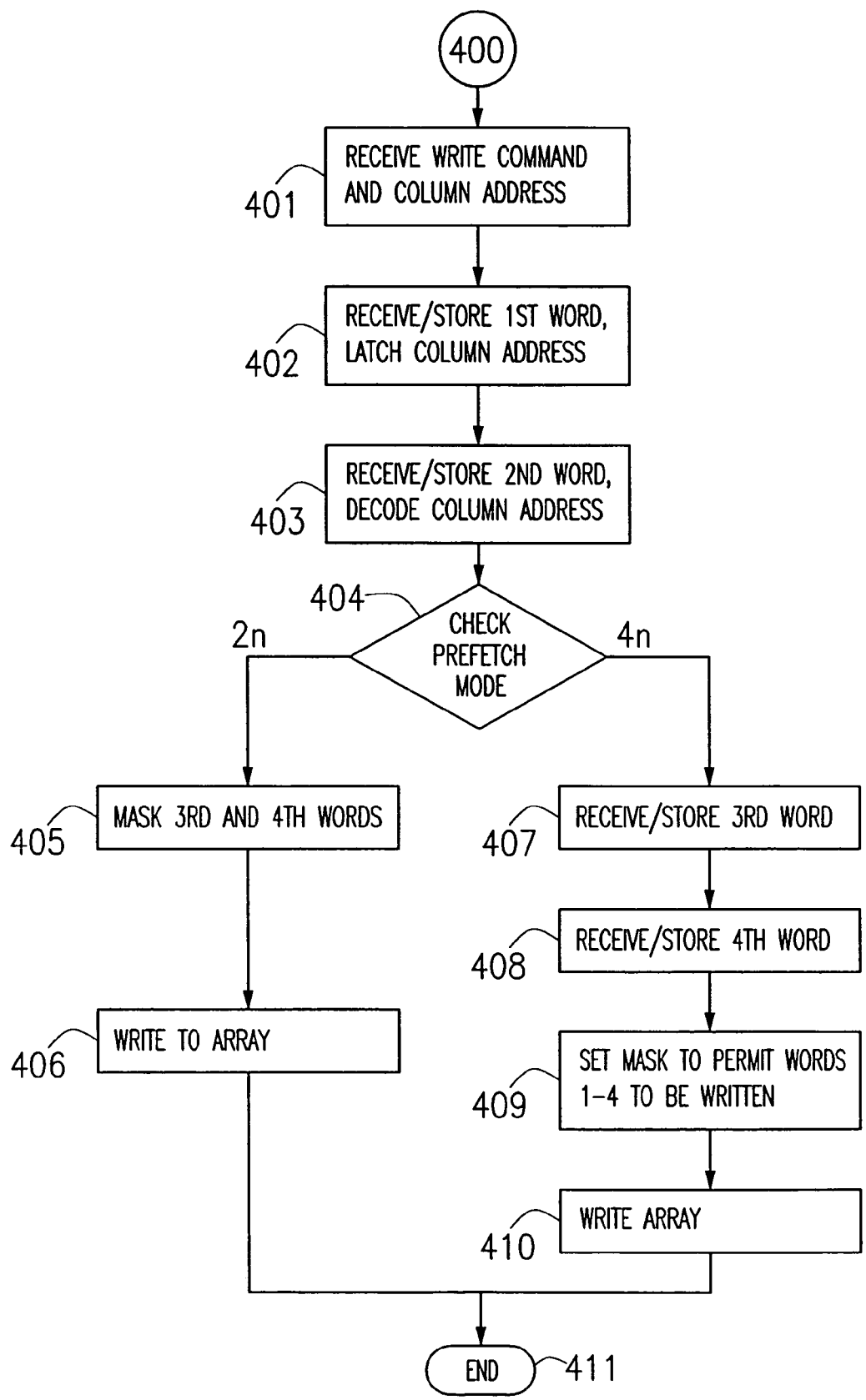
FIG. 4 is a flow chart illustrating a write transaction.

FIG. 4 is a flow chart which describes the steps 400–411 associated with the write process in accordance with the principles of the present invention. The process begins at step 401, where the command decoder 102 receives a write command over control lines 151 and the address register 104 receives a column address over address lines 152. (It is assumed that a row address has been previously latched into the address register 104 through the use of an activate command.) The process continues at step 402, where the column address is latched into the column address latch and counter 106. Simultaneously, write data supplied on data lines 153 is received by receiver 114 and stored as a first data word in input register 115. At step 403, the column decoder 107 decodes the column address and sends the decoded address to the gating logic 110. Simultaneously, new write data supplied on data lines 153 is received by the receiver 114 and stored as a second data word in input register 116.

At this point sufficient data has been received for the smallest supported prefetch mode in the exemplary embodiment (i.e., the 2n prefetch mode). However, if the SDRAM 100 is operating at a larger prefetch mode (e.g., the 4n prefetch mode), additional data is required before the array 108 can be written. Therefore, at step 404, the control logic checks to see which prefetch mode has been set. As noted above, this may include checking a portion of a mode register 103*a* or one or more programmable elements such as fuses 103*b*.

If the smallest prefetch mode is active, execution continues at step 405, where the control logic 101, via signal line 122, sets the write masking logic to mask the data words not associated the current prefetch mode. In the exemplary embodiment this would corresponds to words 3 and 4. Once theses words have been masked, the array 108 is written in step 406. Since words 3 and 4 have been masked by the write masking logic 116, only words 1–2 have been altered in the array. Having written the 2 words associated with the 2n prefetch mode, execution terminates at step 410.

On the other hand, if the larger prefetch mode is active, additional data is required. Execution therefore continues at step 407 (after step 404). In steps 407–408, the third and fourth data words are received from the data lines 153 and stored as the third and fourth data words, respectively, of the input register 115. At this point all four data words have been received, therefore the control logic, via signal line 112, sets the write mask logic 116 to permit all four data words to be written to the memory array 108 (step 409). Once the memory array has been written in step 410, the write has been completed and execution terminates at step 411.

Figure 5:
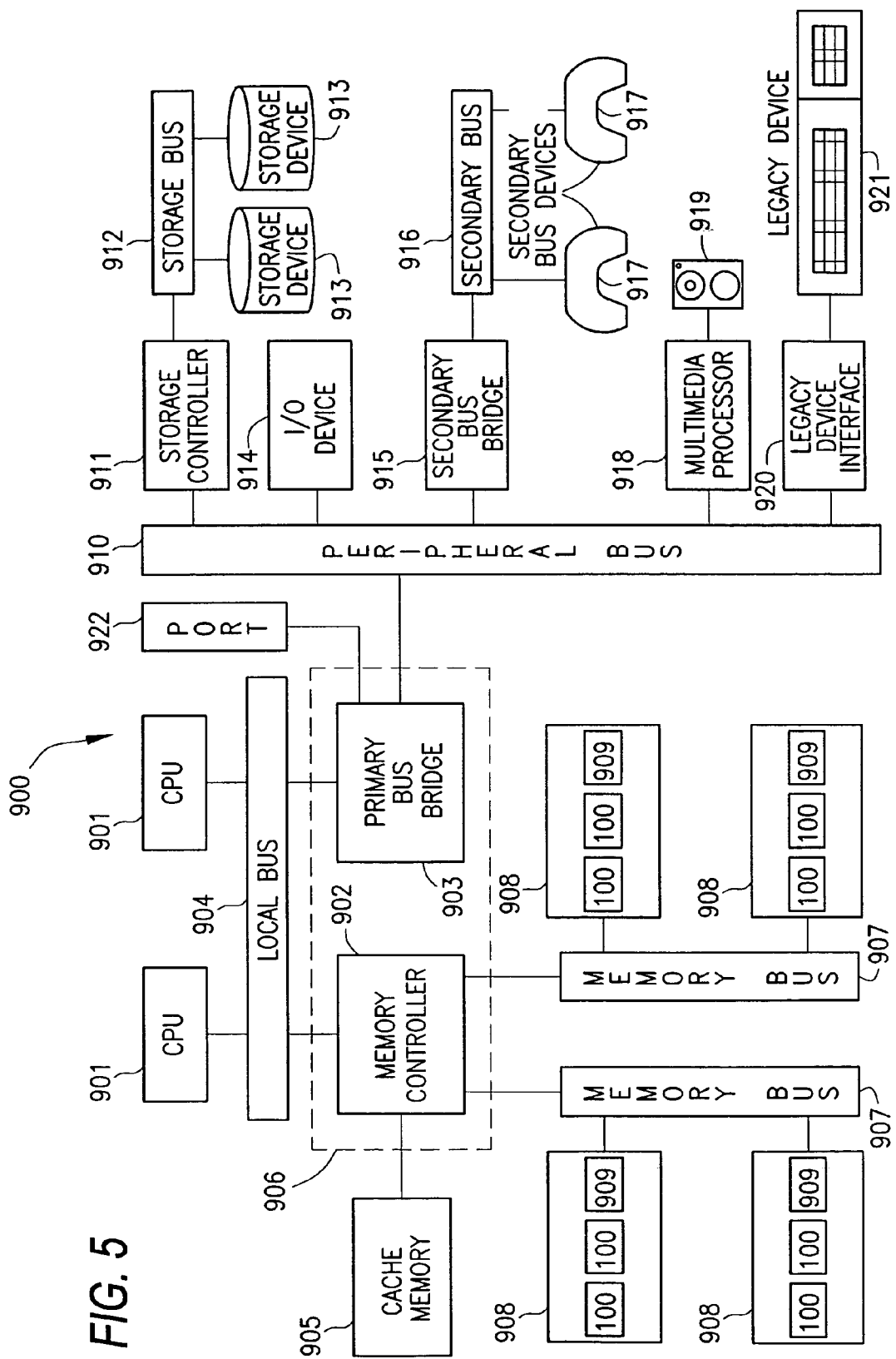
FIG. 5 is a illustration of a processor based system with a memory device in accordance with the principles of the present invention.

FIG. 5 illustrates an exemplary processing system 900 which may utilize the memory device 100 of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 9 is only an exemplary processing system with which the invention may be used. While FIG. 9 illustrates a processing architecture especially suitable for a general purpose computer, such as a personal computer or a workstation, it should be recognized that well known modifications can be made to configure the processing system 900 to become more suitable for use in a variety of applications. For example, in some applications a point-to-point memory architecture may be desirable. Alternatively, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

Thus, the present invention permits a single memory device to be compatible with at least two prefetch modes. In one embodiment, the memory device may be user programmed to operate at a particular prefetch mode by setting the appropriate field in a mode register 103a. Alternatively, the memory device may include manufacturer programmable elements, such as fuses 103a or anti-fuses, whose state indicate which prefetch mode the memory device will use.

For reads the present invention internally reads data corresponding to the largest supported prefetch size and stores the read data into an internal read latch 111. The read data is then output one word per data transfer period. When all the data corresponding to the current prefetch mode has been output, the read complete. Thus, any additional data stored in the internal read latch 111 is not outputted.

For writes, the present invention accepts write data one word at a time and stores the write data sequentially into different data word positions of an input register 115. As sufficient data is received corresponding to the each supported prefetch mode, the control logic 101 of the checks to see if enough data has been received for the present prefetch mode. If so, the control logic 101 sets the write masking logic 116 to mask out any data word not included in the prefetch mode and writes the data to the memory array. The write masking logic 116 ensures that only those data locations corresponding to the data words of the current prefetch mode is altered. If not enough data has been received by the current prefetch mode, additional data words are accepted and stored in successive word locations of the input register.

While the invention has been described in detail in connection with the exemplary embodiment, it should be understood that the invention is not limited to the above disclosed embodiment. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A memory device supporting a plurality of possible prefetch modes, including at least a maximum prefetch mode and a minimum prefetch mode, comprising:
   a memory array;
   a read circuit comprising a read latch and coupled to the memory array for transferring a first plurality of words corresponding to said maximum prefetch mode from said memory array to said read latch, and for transferring a second plurality of words from said read latch to an external device, wherein said second plurality is a controllable parameter of said read circuit and is equal to or less than said first plurality;
   a programmable element for storing a current prefetch mode chosen from a plurality of possible prefetch modes; and
   a control circuit coupled to said read circuit;
   wherein said control circuit, in response to a read command, detects the current prefetch mode stored in said programmable element, and operates said read circuit by setting said second plurality to correspond to the current prefetch mode.

2. The memory device of claim 1, wherein said read circuit further comprises a multiplexer coupled to the control circuit, and said transferring of the second plurality of words is performed by the multiplexer coupling a different portion of said read latch to a driver circuit on each of a plurality of data transfer periods.

3. The memory device of claim 1, wherein said programmable element is at least a portion of a mode register of said memory device.

4. The memory device of claim 1, wherein said programmable element comprises at least one fuse or anti-fuse.

5. The memory device of claim 1, wherein said programmable element comprises at least one pin of said memory device.

6. The memory device of claim 1, wherein said maximum prefetch mode is an integer multiple of said minimum prefetch mode.

7. The memory device of claim 6, wherein said minimum prefetch mode is two words.

8. The memory device of claim 6, wherein said maximum prefetch mode is four words.

9. A memory device comprising:
a memory array;
a write circuit coupled to said memory array for receiving a plurality of words from an external device to be stored in the memory device, said write circuit comprising:
at least one input register;
a control circuit coupled to said write circuit; and
a programmable element for storing a prefetch mode chosen from a plurality of possible prefetch modes;
wherein said control circuit, in response to a write command, detects a current prefetch mode stored in said programmable element; and causes said write circuit to transfer a number of said plurality of words corresponding to the stored prefetch mode which are received from the external device to the at least one input register.

10. The memory device of claim 9, wherein said control circuit, in response to a write command, causes said write circuit to write the transferred words from said at least one input register to said memory array.

11. The memory device of claim 10, wherein said write circuit further comprises a masking logic coupled to the control circuit for masking words not being transferred from said at least one input register to said memory array.

12. The memory device of claim 9, wherein said programmable element is at least a portion of a mode register of said memory device.

13. The memory device of claim 9, wherein said programmable element comprises at least one fuse or anti-fuse.

14. The memory device of claim 9, wherein said programmable element comprises at least one pin of said memory device.

15. The memory device of claim 9, wherein said plurality of possible prefetch modes includes a minimum prefetch mode and a maximum prefetch mode, and said maximum prefetch mode is an integer multiple of said minimum prefetch mode.

16. The memory device of claim 15, wherein said minimum prefetch mode corresponds to transferring two words.

17. A memory device comprising:
a memory array;
a data transfer circuit for performing a read operation by transferring a plurality of words from the memory array to an external device and for performing a write operation by transferring at least some of said plurality of words from the external device to the memory array;
wherein said data transfer circuit is operable in at least
a first prefetch mode to transfer a first number of words without masking and
a second prefetch mode to transfer a second number of words, by masking at least one of said first number of words,
said second number being less than said first number.

18. The memory device of claim 17, further comprising:
a programmable element for storing a prefetch mode,
wherein said data transfer circuit operates in accordance with the prefetch mode stored in said programmable element.

19. The memory device of claim 17, wherein the data transfer circuit, during a read operation in said second prefetch mode, masks said at least one of said first number of words by only transferring to the external device said second number of words.

20. The memory device of claim 17, wherein the data transfer circuit, during a write operation in said second prefetch mode, masks said at least one of said first number of words by only transferring said second number of words to the memory array.

21. The memory device of 20, wherein said portion of the memory array corresponding to the portion of the first number of words not included in said second number of words is write protected.

22. A method for reading a memory device supporting a plurality of prefetch modes, said method comprising the steps of:
transferring a first plurality of words corresponding to a largest of said plurality of prefetch modes from at least one memory array of said memory device to a read latch of said memory device;
detecting a current prefetch mode from a state of a programmable element of said memory device;
if the current prefetch mode corresponds to a first prefetch mode,
transferring the first plurality of words from said read latch to an external device; and
if the current prefetch mode corresponds to a second prefetch mode,
transferring only a second plurality of words from said read latch to an external device,
wherein said second plurality is less than said first plurality.

23. The method of claim 22, wherein said transferring a second plurality of words further comprises causing a multiplexer to couple a different portion of the read latch to an output driver on each data transfer period.

24. A method for writing a memory device supporting a plurality of possible prefetch modes, said method comprising the steps of:
detecting a current prefetch mode from the state of a programmable element of said memory device;
transferring, a plurality of words corresponding to the current prefetch mode from an external device to at least one input register of said memory device;
if the current prefetch mode corresponds to a first prefetch mode,
transferring the plurality of words corresponding to the current prefetch mode from said at least one input register to at least one memory array of the memory device; and
if the current prefetch mode corresponds to a second prefetch mode,
transferring the plurality of words corresponding to the current prefetch mode from said at least one register to at least one memory array of the memory device, while masking a portion of said at least one register not corresponding to the second prefetch mode from being written to the at least one memory array of the memory device.

25. The method of claim 24, wherein said plurality of possible prefetch modes includes a minimum prefetch mode which corresponds to transferring two words.

26. The method of claim 24, wherein said maximum prefetch mode corresponds to transferring four words.

27. A method for operating a memory device supporting a data transfer operation in a plurality of prefetch modes, said method comprising the steps of:
   detecting a current prefetch mode from a state of a programmable element of said memory device;
   if the current prefetch mode corresponds to a first prefetch mode,
      transferring without masking, a first plurality of words between said memory device and an external device; and
   if the current prefetch mode corresponds to a second prefetch mode,
      transferring while masking, a second plurality of words between said memory device and an external device;
   wherein said second plurality is less than said first plurality.

28. The method of claim 27 wherein said data transfer operation is a read and said masking further comprises not outputting to the external device a portion of a read latch.

29. The method of claim 27 wherein said data transfer operation is a write and said masking further comprises not writing to at least one memory array of said memory device, a portion of at least one input register of said memory device.

30. A system comprising:
   a processor;
   a memory coupled to said processor, wherein said memory further comprises,
      a memory array;
      a read circuit comprising a read latch and coupled to the memory array for transferring a first plurality of words corresponding to said maximum prefetch mode from said memory array to said read latch, and for transferring a second plurality of words from said read latch to an external device,
      wherein said second plurality is a controllable parameter of said read circuit and is equal to or less than said first plurality;
      a programmable element for storing a current prefetch mode chosen from a plurality of possible prefetch modes; and
      a control circuit coupled to said read circuit;
   wherein said control circuit, in response to a read command, detects the current prefetch mode stored in said programmable element, and operates said read circuit by setting said second plurality to correspond to the current prefetch mode.

31. A system comprising:
   a processor;
   a memory coupled to said processor, wherein said memory further comprises,
      a memory array;
      a write circuit coupled to said memory array for receiving one word of data per data transfer period from an external device to be stored in the memory device, said write circuit further comprising,
      at least one input register;
      a control circuit coupled to said write circuit; and
      a programmable element for storing a prefetch mode chosen from a plurality of possible prefetch modes;
   wherein said control circuit, in response to a write command, detects a current prefetch mode stored in said programmable element, and causes said write circuit to transfer a number of said plurality of words corresponding to the stored prefetch mode which are received from the external device to the at least one input register.

32. A system comprising:
   a processor;
   a memory coupled to said processor, wherein said memory further comprises,
      a memory array;
      a data transfer circuit for performing a read operation by transferring a plurality of words from the memory array to an external device and for performing a write operation by transferring at least some of said plurality of words from the external device to the memory array;
   wherein said data transfer circuit transfers data between the memory device and an external device, and is operable in at least a first prefetch mode to transfer a first number of words without masking and a second prefetch mode to transfer a second number of words, by masking at least one of said first number of words, said second number being less than said first number.

* * * * *

UNITED STATES PATENT AND TRADEMARK OFFICE
CERTIFICATE OF CORRECTION

PATENT NO. : 6,981,100 B2
DATED : December 27, 2005
INVENTOR(S) : Kevin J. Ryan et al.

It is certified that error appears in the above-identified patent and that said Letters Patent is hereby corrected as shown below:

Title page,
Item [63], Related U.S. Application Data, "2002." should read -- 2002, now Pat. No. 6,895,474 --;

Column 1,
Line 5, "6,828,964" should read -- 6,895,474 --;
Line 27, "transfers" should read -- transfer --;
Line 42, "device" should read -- devices --;
Line 47, "speed which" should read -- speed with which --;

Column 3,
Line 8, "a illustration" should read -- an illustration --;
Line 38, "by on" should read -- by --;

Column 6,
Line 4, "has" should read -- have --;

Column 7,
Lines 23-24, "an miscellaneous" should read -- a miscellaneous --;
Line 25, "an legacy" should read -- a legacy --;
Line 26, "also coupled" should read -- also be coupled --;
Line 37, "an local" should read -- a local --;
Line 41, "an universal" should read -- a universal --;
Line 42, "via to" should read -- via --;
Line 45, "to one additional" should read -- to additional --;
Line 65, "system" should read -- systems --;

UNITED STATES PATENT AND TRADEMARK OFFICE
CERTIFICATE OF CORRECTION

PATENT NO. : 6,981,100 B2
DATED : December 27, 2005
INVENTOR(S) : Kevin J. Ryan et al.

It is certified that error appears in the above-identified patent and that said Letters Patent is hereby corrected as shown below:

<u>Column 8,</u>
Line 18, "read complete" should read -- read is complete --;
Line 23, "to the each" should read -- to each --; and
Line 24, "of the checks" should read -- checks --.

Signed and Sealed this

Thirtieth Day of May, 2006

JON W. DUDAS
*Director of the United States Patent and Trademark Office*